United States Patent [19]

Young et al.

[11] Patent Number: 4,683,443

[45] Date of Patent: Jul. 28, 1987

[54] MONOLITHIC LOW NOISE AMPLIFIER WITH LIMITING

[75] Inventors: James P. Young, Cedar Rapids; Robert J. Weber, Marion, both of Iowa; G. Robert Kaelin, Thousand Oaks, Calif.

[73] Assignee: The United States of America as represented by the Secretary of the Air Force, Washington, D.C.

[21] Appl. No.: 822,579

[22] Filed: Jan. 27, 1986

[51] Int. Cl.$^4$ .............................. H03F 1/52; H03F 3/16
[52] U.S. Cl. ..................................... 330/277; 330/286; 330/296; 330/298; 330/307; 361/91
[58] Field of Search .................... 330/207 P, 277, 286, 330/296, 298, 300, 307; 357/23, 13; 361/56, 91, 111

[56] References Cited

U.S. PATENT DOCUMENTS

| | | | |
|---|---|---|---|
| 3,286,189 | 11/1966 | Mitchell et al. | 330/18 |
| 3,465,260 | 9/1969 | Sullivan | 330/17 |
| 3,678,402 | 7/1972 | Tempel | 330/9 |
| 4,011,518 | 3/1977 | Irvine et al. | 330/23 |
| 4,174,503 | 11/1979 | Merklinger et al. | 330/298 X |
| 4,338,572 | 7/1982 | Schurmann | 330/277 |

*Primary Examiner*—James B. Mullins
*Attorney, Agent, or Firm*—William G. Auton; Donald J. Singer

[57] ABSTRACT

A single circuit which provides forward biasing, input impedance matching and voltage input limiting to a transistor which has a source, gate and drain terminal is presented. Biasing, input matching and limiting for a transistor is accomplished using two inductor coils, five crystal diodes, a positive voltage source, and three resistors. The forward biasing is achieved using three resistors, and the third, fourth and fifth crystal diode. The third resistor connects the drain terminal of the transistor to the positive voltage source. The second resistor connects the junction between the third resistor and the drain terminal to the transistor's gate terminal. The fourth and fifth crystal diodes are connected in series between the source terminal and the common electrical ground. The first resistor and third diode are connected in parallel between the transistor's gate terminal and the common electrical ground. Limiting of the input voltages over the gate terminal is accomplished by the first and second crystal diodes which are connected in series with each other and in a parallel circuit with the first resistor/diode and the common electrical ground. Finally, input impedance matching is accomplished by the two inductor coils which are connected in series with the gate terminal with the first three diodes and first resistor between them. The parasitic impedances of the three cyrstal diodes create a shunt capacitor in parallel with the first resistor. The shunt capacitor to ground and second inductor coil provide impedance matching to the transistor.

4 Claims, 7 Drawing Figures

# MONOLITHIC LOW NOISE AMPLIFIER WITH LIMITING

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to field effect transistor (FET) amplifiers, and specifically to a protection circuit which provides bias, input matching, and limiting to a FET amplifier on a gallium arsenide (GaAs) microwave monolithic integrated circuit (MMIC).

The Global Positioning System (GPS) is used by a variety of users for determining the geodetic location of objects using signals received from GPS satelliles. Currently, there is a need to improve GPS receivers for a number of these users. This improvement includes a reduced size in GPS user sets to less than 100 cubic centimeters, and a reduced power consumption to 1.7 watts. This goal is remarkable in that less than a decade ago, first generation GPS sets were two or more cubic feet in volume and weighed upwards of 100 pounds.

The goal of reducing the volume and power of GPS receivers is attainable through the use of GaAs microwave monolithic integrated circuits, and the low noise amplifier (LNA) of the present invention is intended for use with GPS receivers. This task of providing a low noise amplifier with a limiting circuit to protect the amplifier from high voltages is alleviated, to some degree, by U.S. Pat. No. 4,011,518 issued to Irvine et al on 8 Mar. 1977, the disclosure of which is incorporated herein by reference. The Irvine reference discloses a GaAs field effect transistor (FET) amplifier circuit which provides constant gain under varying temperatures.

GaAs semiconductive devices help attain the goal of reduced volume. However, the limiting circuits of the prior art commonly requires extra components, space and power on the integrated circuit. From the foregoing discussion, it is apparent that there currently exists the need for a protection circuit which reduces the comonents, space and power for FETs which provide limiting, bias and input matching to the LNA. The present invention is intended to satisfy that need.

SUMMARY OF THE INVENTION

The present invention includes a device which provides bias, input matching, and limiting to a FET amplifier on a GaAs microwave monolithic integrated circuit.

In the preferred embodiment of the present invention, the three functions of biasing, input matching and limiting are provided to a FET having a source, gate and drain, positive voltage source and common electrical ground through the use of: 3 resistors, two inductor-coils, and five crystal diodes. This particular embodiment begins with a first input coil, connected to two series crystal diodes at a point above ground. An input resistor which is in parallel with a third crystal is also connected to the junction of the first input coil and the series diodes. A second input coil is connected to the junction of the first input resistor and the third crystal. The other end of the second coil is connected to the gate of an FET. The source conductor of the FET has a pair of series diodes connected to ground. The drain conductor of the FET has two resistors, one connected to the gate terminal and the other to the voltage supply. Bias is achieved by way of the three resistors and the pair of series diodes connected to the source terminal. This bias technique gives a diode to ground. By adding the input pair of series diodes in parallel with the input resistor, the pair performs as a limiter, protecting the FET against high voltages. The parasitic properties of the three input diodes under a low signal condition of the input acts as a shunt capacitor to ground in parallel with the input resistance. The shunt capacitance to ground provides the input match to the FET.

It is a principal object of the present invention to provide proper bias, input matching and limiting to a field effect transistor.

It is another object of the present invention to provide a low noise amplifier with a protection circuit which has a reduced number of components.

It is another object of the present invention to provide a low noise amplifier with a protection circuit while minimizing its power requirements.

It is another object of the present invention to provide a FET amplifier on a GaAs microwave monolithic integrated circuit to reduce the size of GPS receiver units to one hundred cubic centimeters.

These together with other objects features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention is a protection circuit for providing proper bias, limiting and input matching to a field effect transistor while minimizing its voltage requirements as well as its number of components.

Figure 1:
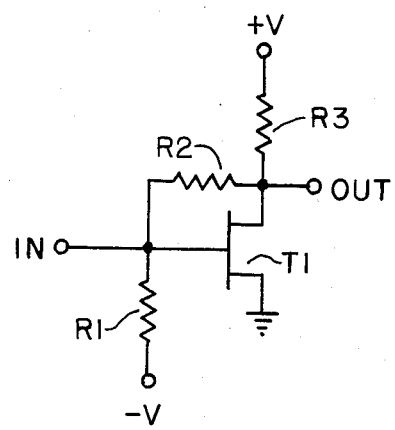
FIGS. 1 and 2 depict two circuits for biasing field effect transistors.
Figure 2:
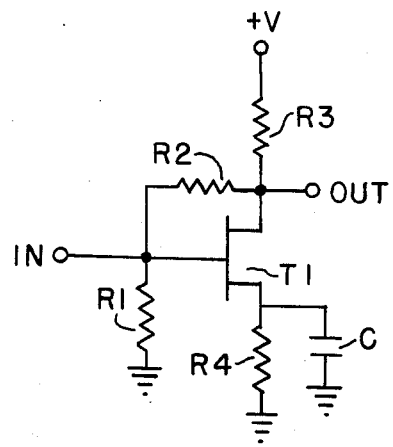

The reader's attention is now directed to FIGS. 1 and 2, which depict two circuits for biasing field effect transistors. These biasing circuits are meant for comparison with the biasing circuit of FIG. 3, which is used in the present invention.

Figure 3:
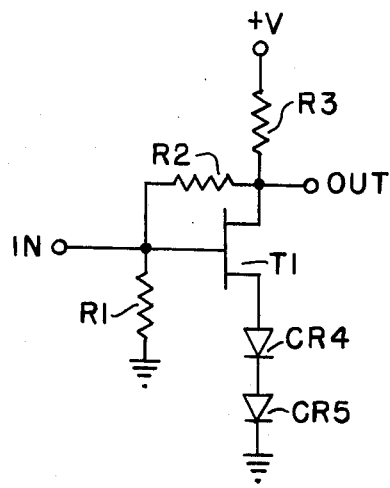
FIG. 3 is the biasing circuit used in the present invention.

The biasing circuit of FIG. 3 is preferred over that of FIG. 1 since it requires fewer power supply voltages. The biasing circuit of FIG. 3 is also known to have greater broadband stability than that of FIG. 2.

Figure 4:
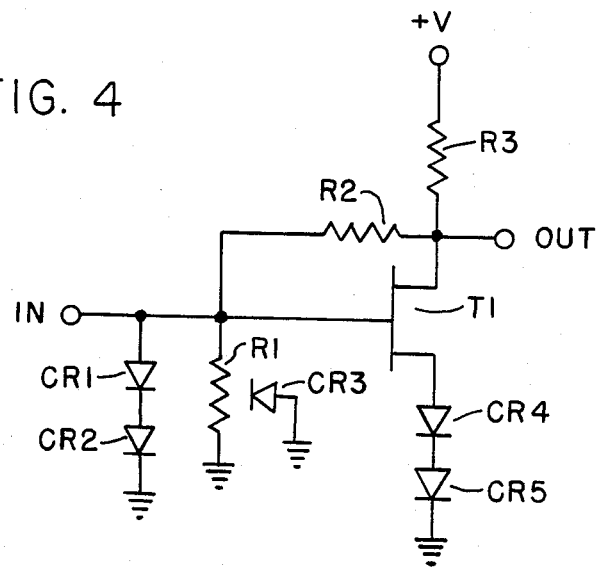
FIG. 4 is an embodiment of the present invention.

FIG. 4 is an embodiment of the present invention which combines the biasing characteristics of FIG. 3 with front end limiting characteristics for the field effect transistor T1. The field effect transistor T1 receives an input signal over its gate terminal, has its drain terminal connected to a positive voltage source, and has its source terminal connected to a common electrical ground. Biasing is achieved in FIG. 4 with resistors $R_1$, $R_2$, $R_3$ and crystal diodes CR4 and CR5. As shown, resistor $R_1$ connects the gate terminal of the transistor to the common electrical ground. Resistors $R_3$ and $R_2$ forward bias the transistor by having $R_3$ connect the drain terminal of the transistor to the positive voltage source, while $R_2$ connects the gate of the transistor to the junction of $R_3$ with the drain terminal of T1. Finally, the bias is achieved by the pair of series diodes which connect the source terminal with the common electrical ground.

The addition of the pair of crystal diodes $CR_1$ and $CR_2$ in parallel with the input resistor/diode $R_1$-$CR_3$ forms a series diode pair which functions as a limiter. The purpose of the limiter is to protect the field effect transistor from high voltages. The third crystal resistor $CR_3$ helps provide input matching to the field effect transistor in a manner discussed below in the discussion of FIG. 5. Crystal diode $CR_3$ is connected in parallel with resistor $R_1$, and is connected with a common electrical ground. Since this crystal diode $CR_3$ is forward biased towards the junction between $R_1$ and $L_2$, its bias helps provide input matching to the field effect transistor $T_1$.

Figure 5:
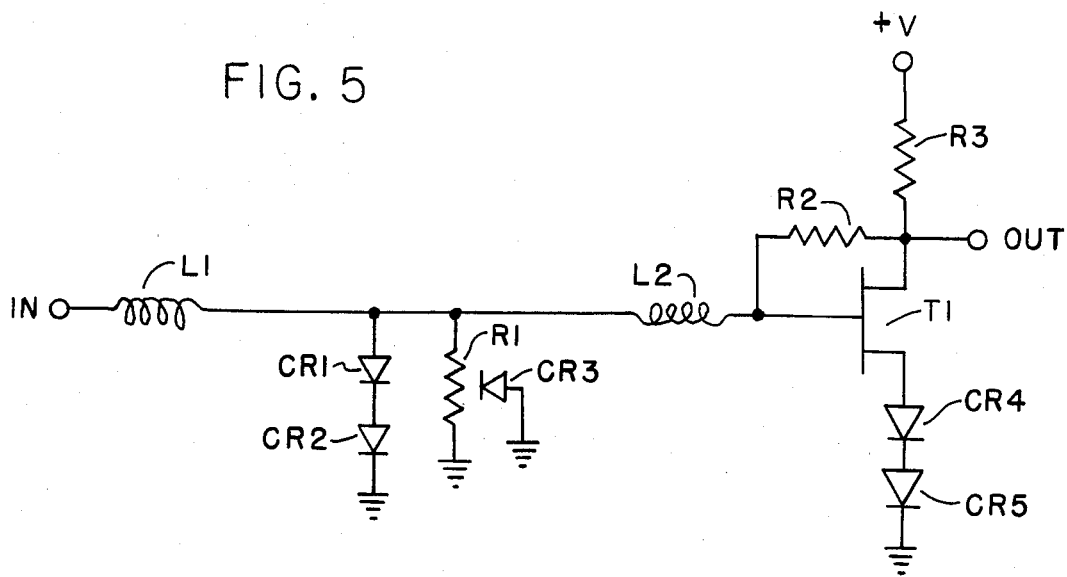
FIG. 5 is the preferred embodiment of the present invention.

FIG. 5 is an illustration of the preferred embodiment of the present invention. This invention is designed to be a low noise amplifier for a receiver of Global Positioning Signals as implemented in a GaAs semiconductor. This amplifier is intended to receive 1-2 $GH_z$ GPS signals in L band from a GPS receive antenna, and amplify them for a filter. Since one of the goals of this receiver is to reduce the required power supply, the voltage in FIG. 5 is a plus 6 volts above the electrical ground. Since another goal is to reduce the required size of the GPS receiver, the present invention would be implemented with a GaAs FET with a 175 micron gate width and a 0.6 to 0.8 micron gate length.

The specific semiconductor design characteristics are discussed below, but first note that the low noise amplifier of FIG. 5 provides a forward bias, input voltage limiting and input matching to the field effect transistor T1 in one simple circuit. Bias is achieved with resistors $R_1$, $R_2$ and $R_3$ and crystal diodes CR4 and CR5 as described in the discussion of FIG. 3. Limiting is achieved with the diodes $CR_1$ and $CR_2$ and $CR_3$ as described in the discussion of FIG. 4. Also, the parasitics of diodes $CR_1$, $CR_2$ and $CR_3$ under a low signal condition at the input appears as a shunt capacitor to ground in parallel with $R_1$. The two input inductor coils $L_1$ and $L_2$ with the simulated shunt capacitor to ground therebetween, as just described, provide the input match to the field effect transistor.

Design of low noise 1-2 $GH_z$ GaAs-MM amplifiers is complicated by several conflicting constraints. The following table summarizes some approximate values for some of these constraints. The table is presented in terms of one micron of gate width for a nominal 0.6 to 0.8 micron gate length GaAs FET at 1-2 $GH_z$.

TABLE I

| | |
|---|---|
| Impedance level | .4 meg. ohm − micron |
| Power Consumption (low noise) (6v supply) | .15 mW/micron |

TABLE I-continued

| | |
|---|---|
| Bandwidth (single pole match) fifty ohm input | 1.1%/$\sqrt{\text{micron}}$ |
| Impedance transformation from fifty ohms | 1.5 ohm/(nH)$^2$ |
| Gain Compression (P out Linear) | 1 to 5 u/W micron |

These values are based on 10 db of gain/stage from 1 to 2 $GH_z$.

Using five nanohenries as the largest value of a practical spiral inductor, the largest impedance transform that can be reached practically at 1 $GH_z$ on the die is about 75 ohms. For low input VSWR this requires a gate width of about 5000 microns. This is about 10 times the width of common low noise FET's. Different circuit configurations need to be studied further as well as further work done in achieving higher values of on chip inductance. However, for the miniature GPS it is very easy to achieve higher inductance values on the alumina substrate carrying the signal to the low noise amplifiers.

Figure 6:
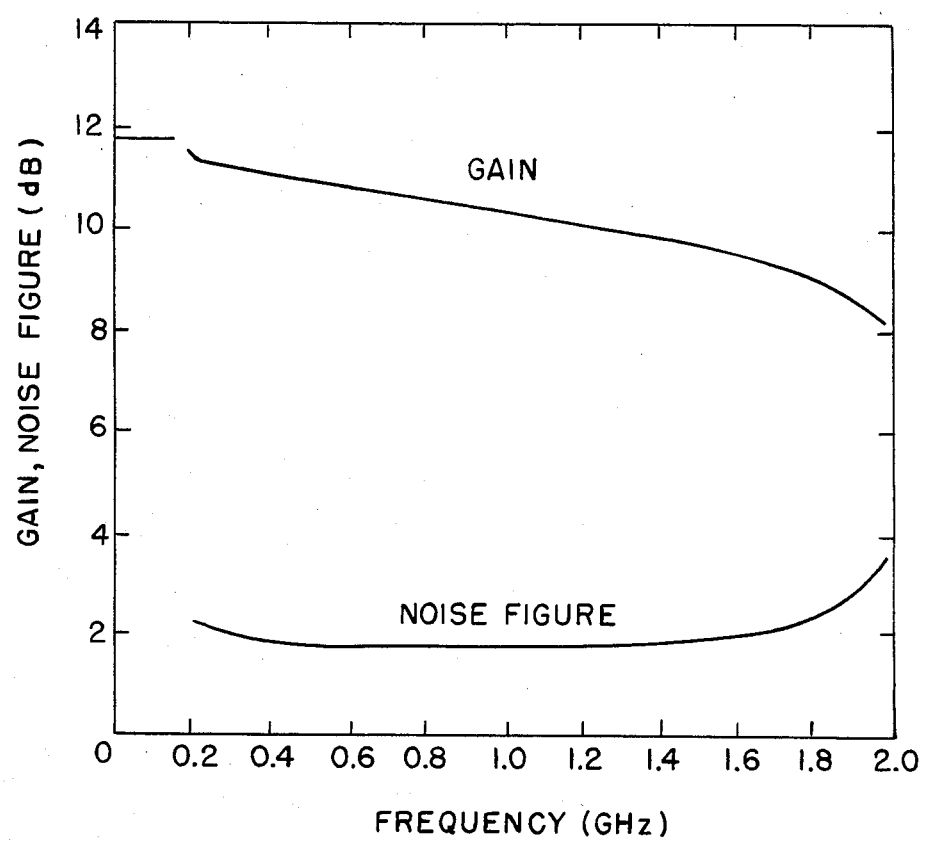
FIG. 6 is a chart of the measured performance of a field effect transistor proposed for use in the present invention.

The low noise amplifier of FIG. 5 was designed to provide about 10 dB of gain and a 2 dB noise figure. FIG. 6 is a chart which illustrates the measured performance of a typical GaAs amplifier. For the GPS receiver, the bias circuit dissipation goal would be to dissipate 25 to 35 mW(4-6 mA at 6 V).

Figure 7:
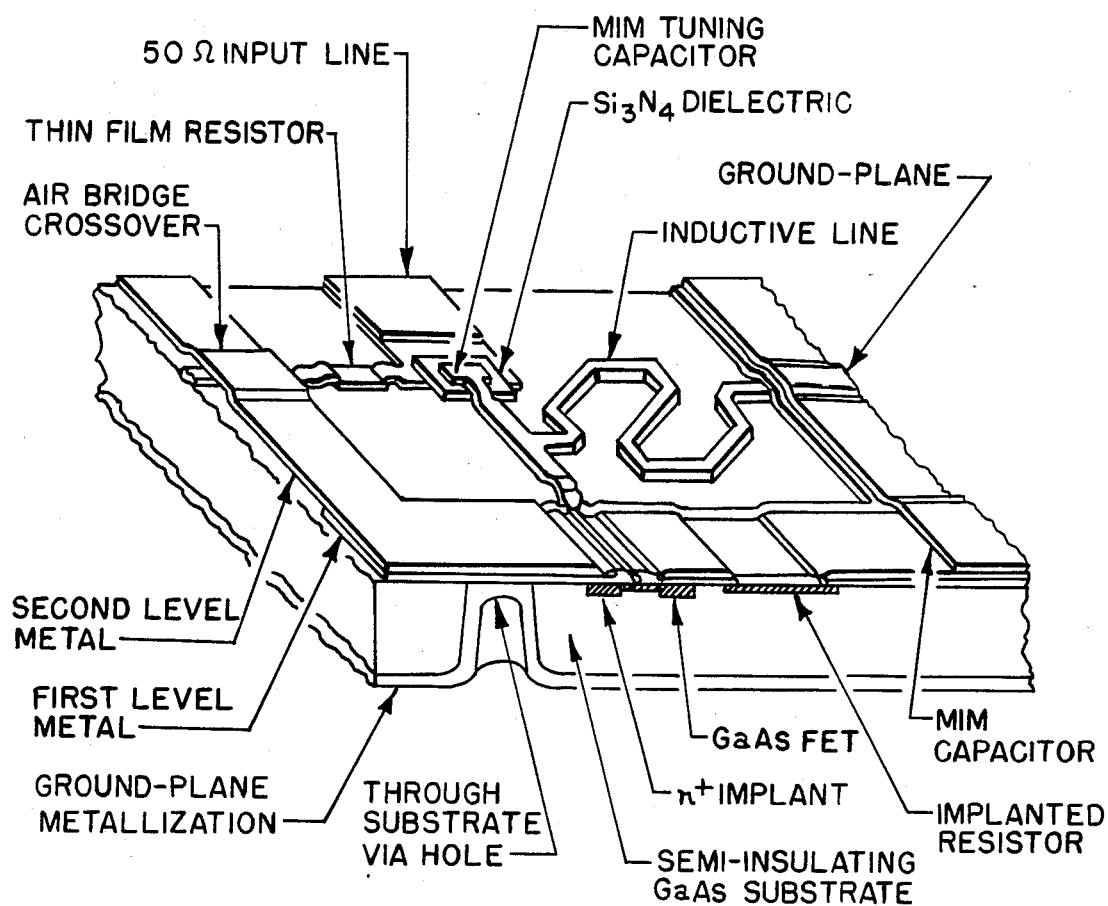
FIG. 7 is a schematic of a typical monolithic microwave integrated circuit, upon which the preferred embodiment would be fabricated.

The implementation of the present invention into a semiconductive device need not be discussed in detail since the use of microwave integrated circuits with field effect transistors is well known in the art. FIG. 7 is a schematic of a typical MMIC analog circuit which uses many of the components described in the present invention. Additionally, the disclosure of Irvine et al teaches a field effect transistor amplifier circuit. It is anticipated that the LNA of the present invention can be built on a 0.3 cm × 0.3 cm chip.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A low noise amplifier comprising:
   a positive voltage source;
   a transistor which receives an input signal over its gate terminal, and produces an amplified signal between its source and drain terminals;
   first, second and third resistors, said first resistor connecting the transistor's gate terminal with a common electrical ground;
   the third resistor connecting the transistor's drain terminal with the positive voltage source and forming an output terminal at its junction with the transistor's drain terminal, said output terminal being where the amplified signal is produced;
   said second resistor providing a forward bias for the transistor by connecting the junction between the third resistor and the transistor's drain terminal with the transistor's gate terminal;
   first, second, third and fourth crystal diodes, said first and second crystal diodes being connected in series and connecting the transistor's gate terminal with the common electrical ground, said first and second crystal diodes being forward biased towards the electrical ground, the first and second crystal diodes together with the first resistor thereby providing limiting protection to the transistor, said limiting protection being a protection of the gate terminal of the transistor from high input voltages;

said third and fourth crystal diodes being connected in series and connecting the transistor's source terminal with a common electrical ground, said third and fourth crystal diode being forward biased towards the common electrical ground, said third and fourth crystal diodes together with the positive voltage source and the first, second and third resistors providing said transistor with a forward bias.

2. A low noise amplifier comprising:

a positive voltage source;

a transistor which receives an input signal over its gate terminal, is connected to the positive voltage source with its drain terminal, and has a source terminal connected with a common electrical ground;

a biasing circuit which electrically connects the transistor to the positive voltage source and the common electrical ground, said biasing circuit providing a forward bias to the transistor;

a means for limiting high input voltages from entering the transistor, said limiting means being electrically connected with the biasing circuit and the transistor; and first and second inductor coils, being connected in series with each other and conducting input signals into the gate terminal of the transistor, said first and second inductor coils being connected to the common electrical ground by the biasing circuit and limiting means, said first and second inductor coils together with impedance in the limiting means and biasing circuit simulating a shunt capacitor which connects the transistor's gate terminal with the common electrical ground, said first and second conductor coils thereby providing input impedance matching between the low noise amplifier and the input signals.

3. A low noise amplifier, as defined in claim 2, wherein the limiting means comprising a first and second crystal diode which are connected in series and connect the first and second inductor coils to the common electrical ground at a junction between the first and second inductor coils, said first and second crystal diodes being forward biased toward the common electrical ground; and a first resistor connected in parallel with the first and second crystal diodes between the junction between the first and second inductor coils and the common electrical ground, said first resistor together with the first and second diodes protecting the transistor's gate terminal from high input voltages.

4. A low noise amplifier, as defined in claim 3, wherein said biasing circuit comprises:

second and third resistors, said third resistor connecting the drain terminal of the transistor to the positive voltage source and providing an output terminal where it connects with the transistor's drain terminal, said output terminal being a location where said transistor produces amplified signals above the common electrical ground;

the second resistor forward biasing the transistor by connecting the junction between the third resistor and the transistor's drain terminal to the transistor's gate terminal;

a third crystal diode being connected in parallel with the first resistor between the common electrical ground and the junction between the first and second inductor coils, said third crystal diode being biased away from the common electrical ground; and a fourth and fifth crystal diode which are connected in series and connect the transistor's source terminal with the common electrical ground, said fourth and fifth crystal diodes being forward biased towards the common electrical ground.

* * * * *